(12) United States Patent
Markovic et al.

(10) Patent No.: US 12,320,962 B2
(45) Date of Patent: Jun. 3, 2025

(54) OPTICAL ELEMENTS AND WAFERS INCLUDING OPTICAL ELEMENTS

(71) Applicant: HEPTAGON PHOTONICS PTE. LTD., Singapore (SG)

(72) Inventors: Uros Markovic, Eindhoven (NL); Nicola Spring, Eindhoven (NL)

(73) Assignee: HEPTAGON PHOTONICS PTE. LTD., Singapore (SG)

( * ) Notice: Subject to any disclaimer, the term of this patent is extended or adjusted under 35 U.S.C. 154(b) by 527 days.

(21) Appl. No.: 17/254,201

(22) PCT Filed: Jun. 14, 2019

(86) PCT No.: PCT/SG2019/050298
§ 371 (c)(1),
(2) Date: Dec. 18, 2020

(87) PCT Pub. No.: WO2019/245454
PCT Pub. Date: Dec. 26, 2019

(65) Prior Publication Data
US 2021/0271058 A1    Sep. 2, 2021

Related U.S. Application Data

(60) Provisional application No. 62/686,992, filed on Jun. 19, 2018.

(51) Int. Cl.
G02B 13/00    (2006.01)
G02B 3/00    (2006.01)
G02B 5/20    (2006.01)

(52) U.S. Cl.
CPC ....... *G02B 13/0085* (2013.01); *G02B 3/0031* (2013.01); *G02B 5/20* (2013.01)

(58) Field of Classification Search
CPC .... G02B 13/0085; G02B 3/0031; G02B 5/20; G02B 3/0012; G02B 1/04; G02B 3/0025;
(Continued)

(56) References Cited

U.S. PATENT DOCUMENTS 7,974,023 B1 *  7/2011  Chen .................. G02B 13/0085
                                                    359/619
9,121,994 B2     9/2015  Brouwer et al.
(Continued)

FOREIGN PATENT DOCUMENTS

CN    102023324 A    4/2011
CN    102343681 A    2/2012
(Continued)

OTHER PUBLICATIONS

PCT/SG2019/050298 International Search Report and Written Opinion, mailed Nov. 20, 2019, 21 pages.
(Continued)

*Primary Examiner* — Ephrem Z Mebrahtu
(74) *Attorney, Agent, or Firm* — Viering, Jentschura & Partner mbB; Robert M Bilotta, Jr.

(57) ABSTRACT

An optics wafer includes replicated optical elements such as lenses that can be formed without the use of a separate glass or other substrate on which the optical elements would otherwise need to be replicated or mounted.

19 Claims, 11 Drawing Sheets

(58) Field of Classification Search
CPC ........ B29D 11/00307; B29D 11/00403; B29D 11/00375; H01L 27/14685
See application file for complete search history.

(56) References Cited

U.S. PATENT DOCUMENTS

| | | |
|---|---|---|
| 2009/0290833 A1 | 11/2009 | Han et al. |
| 2012/0026595 A1 | 2/2012 | Sasaki |
| 2012/0081801 A1* | 4/2012 | Duparre ........... B29D 11/00307 359/811 |
| 2012/0189800 A1 | 7/2012 | Fujiwara et al. |
| 2013/0271826 A1 | 10/2013 | Widmer |
| 2014/0240845 A1 | 8/2014 | Koike et al. |
| 2015/0034975 A1 | 2/2015 | Rudmann et al. |
| 2015/0168666 A1 | 6/2015 | Brouwer |
| 2015/0206914 A1 | 7/2015 | Rudmann |
| 2016/0218239 A1 | 7/2016 | Gubser et al. |
| 2016/0247976 A1 | 8/2016 | Rudmann et al. |
| 2016/0282176 A1* | 9/2016 | Friese ................. G02B 19/0085 |
| 2017/0050347 A1* | 2/2017 | Coninx ................ B29C 39/025 |
| 2017/0242159 A1 | 8/2017 | Sung |
| 2018/0239116 A1 | 8/2018 | Yu et al. |

FOREIGN PATENT DOCUMENTS

| | | |
|---|---|---|
| CN | 102037383 B | 9/2014 |
| CN | 102770786 B | 12/2014 |
| CN | 103842144 B | 8/2015 |
| CN | 104781933 B | 7/2017 |
| CN | 108076671 A | 5/2018 |
| EP | 2366534 A2 | 9/2011 |
| JP | 2011062879 A | 3/2011 |
| JP | 2011113074 A | 6/2011 |
| KR | 20080015294 A | 2/2008 |
| WO | 2017034402 A1 | 3/2017 |

OTHER PUBLICATIONS

Office Action issued for related application, CN 202210882651.2, issued Mar. 22, 2022, 9 pages.
Office Action with Search Report issued for related application, CN202210882651.2, issued Aug. 9, 2023, 21 pages.
Chinese office action issued for the corresponding Chinese patent application No. 202210882651.2, dated Feb. 6, 2024, 10 pages (for informational purposes only).
Chinese office action issued for the corresponding Chinese patent application No. 202210882651.2, dated May 24, 2024, 6 pages (for informational purposes only).

* cited by examiner

OPTICAL ELEMENTS AND WAFERS INCLUDING OPTICAL ELEMENTS

CROSS-REFERENCE TO RELATED APPLICATIONS

This application is a 371 U.S. National Phase of PCT International Patent Application No. PCT/SG2019/050298, filed on Jun. 14, 2019, which claims benefit and priority to U.S. provisional patent application No. 62/686,992 filed on Jun. 19, 2018, the disclosures of which are each incorporated by reference herein in their entirety for all purposes.

FIELD OF THE DISCLOSURE

This disclosure relates to optical elements such as lenses, and wafers that include optical elements.

BACKGROUND

Smartphones and other handheld or portable devices sometimes include miniaturized optoelectronic modules such as imaging devices and/or light projectors. The optoelectronic modules may employ optical assemblies that include lenses or other passive optical elements stacked along the module's optical axis to achieve desired optical performance. In some applications, space typically is at a premium. Thus, it can be important to maintain a relatively small overall z-height for the module or optical assembly so as to achieve a compact module.

SUMMARY

The present disclosure describes methods for the formation of replicated optical elements, and optics wafers that include replicated optical elements such as lenses. The optical elements can be formed, for example, using combined replication and vacuum injection tools and, in some cases, can be formed without the use of a separate glass or other substrate on which the optical elements are replicated or mounted.

For example, in one aspect, a method of manufacturing an optics assembly includes providing a first polymer material on respective replication surfaces of first and second tools, bringing the first and second tools toward one another such that the first polymer material on a replication surface of the first tool merges with the first polymer material on an opposing replication surface of the second tool, and subsequently hardening the first polymer material to form respective optical elements having optical surfaces based on respective shapes of the replication surfaces on which the first polymer was provided. A second polymer material that is different from the first polymer material, is injected into spaces between the first and second tools such that the second polymer material is in contact with lateral side edges of the optical elements. Subsequently, the second polymer material is hardened to form an optics assembly that includes the optical elements, each of which is surrounded laterally by the hardened second polymer material. The first and second tools then can be removed from the optics assembly.

By obviating the need for a glass or other substrate on which to form the optical elements of the optics wafer, the foregoing techniques can, in some cases, result in a less expensive manufacturing process. Further, the resulting optics wafers can, in some instances, have a relatively small overall height.

In some implementations, the optics assembly includes stacks of optical elements replicated on one another. For example, in accordance with some implementations, a method of manufacturing an optics assembly includes providing a first polymer material on respective replication surfaces of first and second tools, bringing the first and second tools toward one another such that the first polymer material on a replication surface of the first tool merges with the first polymer material on an opposing replication surface of the second tool, and subsequently hardening the first polymer material to form a first group of optical elements having optical surfaces based on respective shapes of the replication surfaces on which the first polymer was provided. The method further includes injecting a second polymer material, which is different from the first polymer material, into spaces between the first and second tools such that the second polymer material is in contact with lateral side edges of the optical elements of the first group. The second polymer material subsequently is hardened. A second group of optical elements is replicated directly, or indirectly, on the optical elements of the first group, and a third polymer material is injected into spaces between lateral side edges of the optical elements of the second group. The third polymer then is hardened.

According to another aspect, a wafer-level method of manufacturing optical structures includes providing a first polymer material on respective replication surfaces of first and second tools, bringing the first and second tools toward one another such that the first polymer material on a replication surface of the first tool merges with the first polymer material on an opposing replication surface of the second tool, and subsequently hardening the first polymer material to form respective optical structures each of which includes an optical element and a surrounding portion laterally surrounding the respective optical structure. A second polymer material, different from the first polymer material, is vacuum injected such that at least some of the injected second polymer material is in contact with lateral sides of the surrounding portions of the optical elements. The method includes continuing to apply the vacuum after vacuum injecting the second polymer material so as to remove a portion of the previously injected second polymer material, and so as leave a coating of the second polymer material on the lateral sides of each of the surrounding portions. Subsequently, the second polymer material is hardened to form the optical structures, each of which includes: one of the optical elements, the respective surrounding portion, and the coating on the lateral sides of the respective surrounding portion. The first and second tools then are removed from the optical structures.

In some cases, the latter method includes removing the first tool from the optical structures and placing a carrier tape in contact with the optical structures while the second tool remains in contact with the optical structures. The second tool subsequently can be removed from the optical structures.

The present disclosure also describes optics wafers and modules including optical elements.

Other aspects, features and advantages will be readily apparent from the following detailed description, the accompanying drawings and the claims.

DETAILED DESCRIPTION

The present disclosure describes the formation of replicated passive optical elements, and optics wafers that include replicated passive optical elements such as lenses. Such optics wafers can be integrated into wafer-level manufacturing processes in which multiple optoelectronic modules are fabricated in parallel by forming stacks of optics and other wafers, and subsequently separating (e.g., by dicing) the stack into the individual modules. As the host device (e.g., smartphone or other small, mobile computing device) in which the optoelectronic module is disposed may have a limited z-height (i.e., thickness), reducing the overall thickness of the optoelectronic module can be an important consideration. Reducing the thickness of the optics wafer, in turn, is one way to help reduce the overall thickness of the module.

The following paragraphs describes technique for forming an optics wafer that includes multiple replicated passive optical elements separated laterally from one another by separation walls that can be composed, for example, of a material (e.g., non-transparent polymer) that differs from the material of the optical elements. The passive optical elements can be operable, for example, to redirect light by refraction and/or diffraction and/or reflection, with each optical element being surrounded laterally by non-transparent material. Examples of such passive optical elements include lenses and prisms, as well as other diffractive or refractive structures. The passive optical elements as well as the non-transparent material can be formed, for example, using combined replication and vacuum injection tools, and can be formed without the use of a separate glass or other substrate on which such optical elements would otherwise need to be formed.

Figure 1:
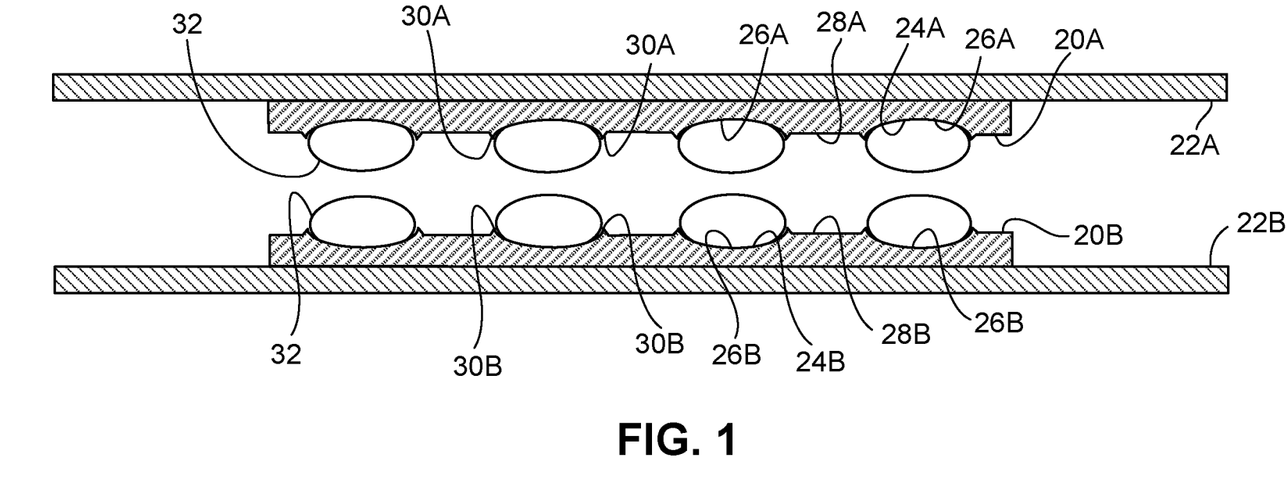
FIGS. 1-3 illustrate steps in a first process for forming an optics wafer that includes replicated optical elements.

As shown in the example of FIG. 1, first and second tools 20A, 20B are held, respectively, by glass or other carriers 22A, 22B. The tools 20A, 20B serve as combined replication and vacuum injection tools because they are used for formation of replicated optical elements as well as non-transparent vacuum injected regions of the optics wafer. Each tool 20A, 20B has a respective replication surface 24A, 24B that defines areas for the replication of the passive optical elements. In general, the shape of the replication surfaces includes "negatives" of the shape of the optical elements to be formed. In the illustrated example, the replication surfaces 24A, 24B include concave shaped cavities 26A, 26B which are used to form double convex shaped lenses. The precise shape of the replication surfaces 24A, 24B of the tools 20A, 20B may differ in other implementations to facilitate the formation of optical elements having shapes that differ from the shape of the lenses in the illustrated example. Thus, the shape of the replication surfaces 24A, 24B can be modified to facilitate formation of lenses having convex or concave surfaces, as well as surfaces having other shapes. The shape of the replication surfaces 24A, 24B can be modified to facilitate formation of other types of optical elements (e.g., Fresnel lenses).

The concave shaped cavities 26A of the first tool 20A are separated from one another by a respective separation surface 28A of the tool 20A. In the illustrated example, the outer lateral edge 30A of each replication surface 24A projects slightly outward beyond the adjacent separation surfaces 28A to form a relatively sharp edge. Likewise, the concave shaped cavities 26B of the second tool 20B are separated from one another by a respective separation surface 28B of the tool 20B. In the illustrated example, the outer lateral edge 30B of each replication surface 24B projects slightly outward beyond the adjacent separation surfaces 28B to form a relatively sharp edge. In other implementations, the lens tools can have different shapes for the replication surfaces.

As further shown in FIG. 1, a small amount of material 32 ("lens material") for the formation of passive optical elements is deposited on each of the cavities 26A, 26B of the tools 20A, 20B. The lens material 32 can be, for example, a liquid epoxy or other polymer that, when hardened (e.g., cured), is transparent to a particular wavelength or range of wavelengths. The lens material 32 can be deposited, for example, by jetting the liquid epoxy onto the cavities 26A, 26B. The two tools 20A, 20B then are aligned using, for example, a mask aligner.

Figure 2:
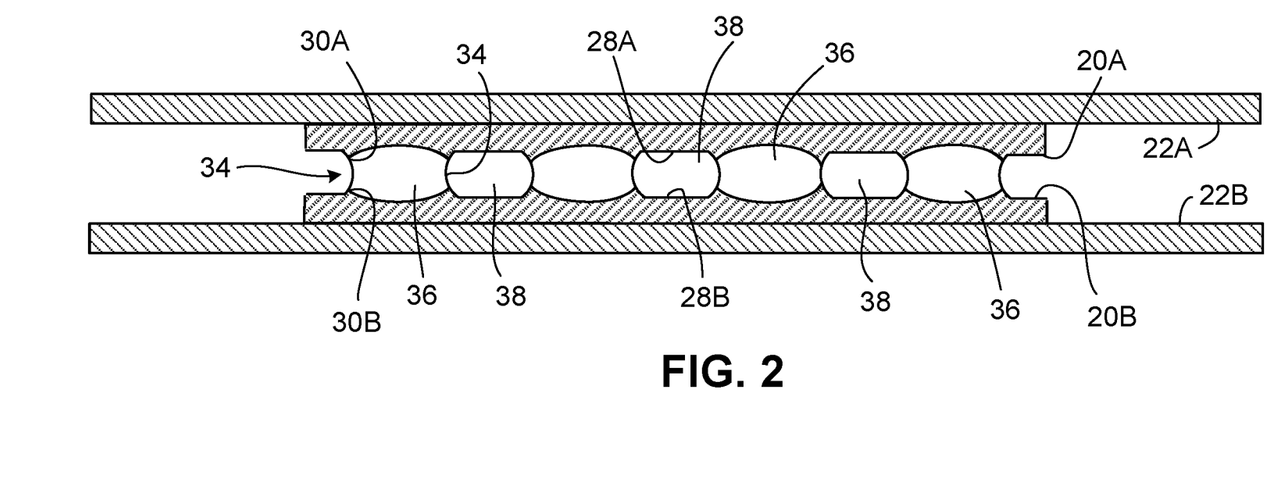

After the tools 20A, 20B are aligned, they are brought into contact with one another such that the lens material 32 on each particular cavity 26A of the first tool 20A is brought into contact with the lens material 32 on an opposing cavity 26B of the second tool 20B, as shown in FIG. 2. In some instances, one or both of the tools 20A, 20B have spacers extending toward the opposite tool so as to maintain a specified distance between the two tools when the tools are in contact with one another. As the tools are brought together, the lens material 32 on each pair of opposing cavities 26A, 26B merges into a single volume 36 of lens material. The sharp edges 30A, 30B at the lateral borders of the replication surfaces 24A, 24B cause the liquid epoxy to develop a concave-shaped meniscus 34 laterally around the volume 36 of lens material. After the meniscus 34 develops, the liquid epoxy lens material is hardened, for example, by UV-curing, thermal curing, or both. Each volume 36 of lens material thus forms a lens or other passive optical element. In this example, the lateral side edges of each optical element 36 have a concave shape at an interface with the surrounding material. The foregoing technique allows the passive optical elements to be formed by double replication in a single replication process (i.e., replicating two different surfaces of each optical element at the same time).

Figure 3:
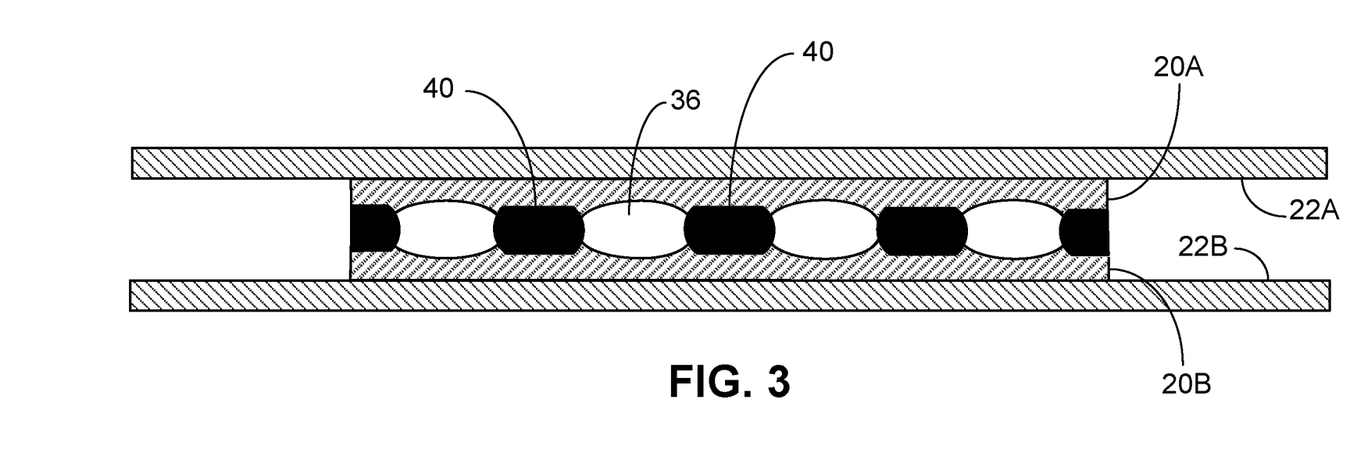

Next, the spaces 38 between opposing separation surfaces 28A, 28B of the tools 20A, 20B are filled with an epoxy or other polymer that differs from the material 32 used to form the optical elements 36. For example, preferably, the spaces 38 are filled with an epoxy or other polymer that, when hardened (e.g., cured), is substantially non-transparent (or significantly attenuates) to light of the particular wavelength or range of wavelengths of interest. Examples of such polymer materials include an epoxy, acrylate, polyurethane, or silicone containing a non-transparent filler such as carbon black, a pigment, or dye. The non-transparent material can be injected into the spaces 38, for example, by vacuum injection while the tools 20A, 20B remain in place. The non-transparent, vacuum injected material then is hardened (e.g., by UV curing, thermal curing or both) to form non-transparent separation regions 40 that separate the previously formed passive optical elements 36 from one another, as shown in FIG. 3. The tools 20A, 20B then can be removed to yield an optics wafer 42.

Figure 4:
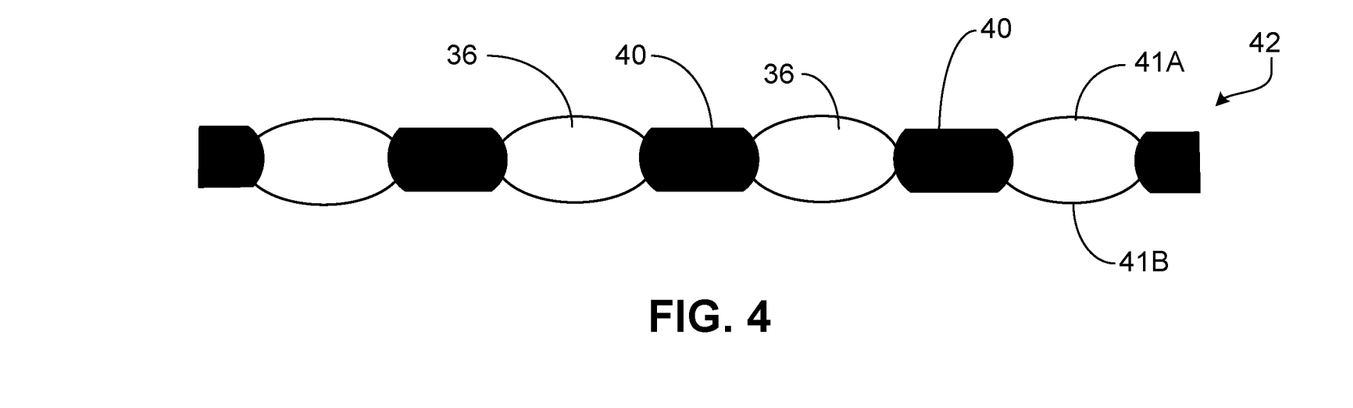
FIG. 4 illustrates a cross-sectional view of an optics wafer resulting from the process of FIGS. 1-3.

As shown in FIG. 4, the optics wafer 42 includes multiple passive optical elements 36 separated from one another by non-transparent regions 40. The non-transparent regions 40 are fused to the adjacent optical elements and thus serve to hold the optical elements 36 together in the optics wafer. Thus, there is no need for a separate glass or other substrate on which to form the lenses or other optical elements. Further, the non-transparent regions 40 serve as optical barriers or separation walls between adjacent optical elements 36. In the illustrated example, the material of which each of the optical elements 36 is composed is the same throughout the thickness of the optical element (i.e., from its first optical surface 41A to its second optical surface 41B). Further, in this example, each of the first and second optical surfaces 41A, 41B forms a respective interface with a fluid (e.g., air).

By obviating the need for a glass or other substrate on which to form the optical elements 36, the foregoing technique can, in some cases, result in a less expensive manufacturing process. Further, the resulting optics wafer 42 can have a relatively small overall height. In some cases, the technique also can result in a relatively small footprint for each optical element.

Figure 5:
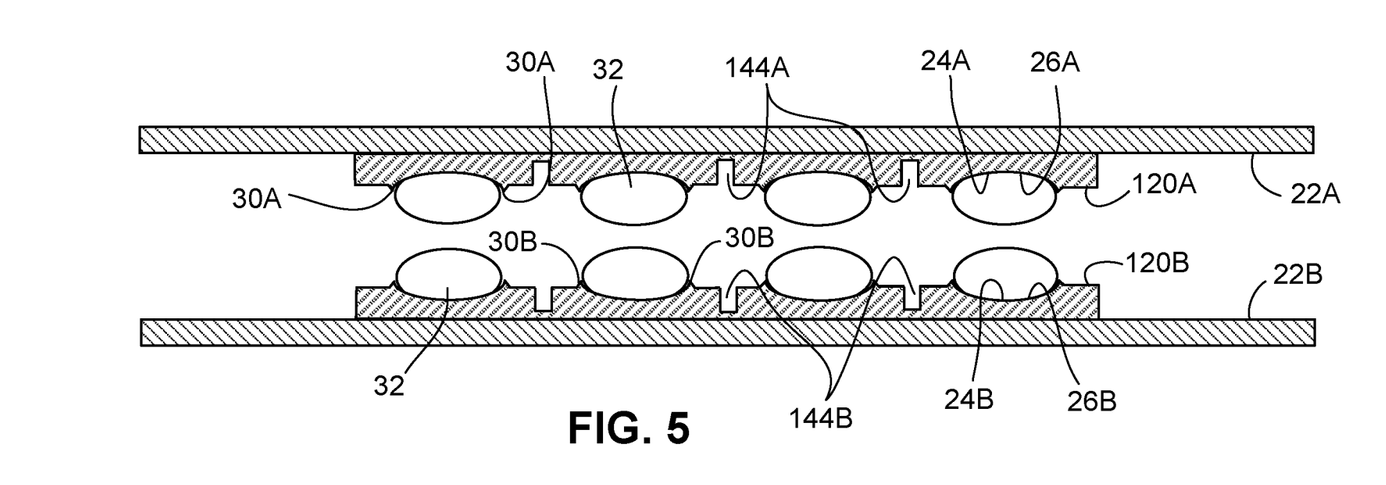
FIGS. 5-7 illustrate steps in a second process for forming an optics wafer that includes replicated optical elements.

In some instances, one or both of the tools 20A, 20B can be modified to include features that facilitate the formation of spacers or baffles extending from the separation walls 40. An example is illustrated in FIG. 5, which includes a first tool 120A and a second tool 120B. The tool 120A is similar to the tool 20A discussed above with respect to FIG. 1, except that the concave shaped cavities 26A of the tool 120A are separated from one another by a separation surface that has respective grooves 144A. Likewise, the tool 120B is similar to the tool 20B discussed above with respect to FIG. 1, except that the concave shaped cavities 26B of the tool 120B are separated from one another by a separation surface that has respective grooves 144B.

As further shown in FIG. 5, a small amount of material 32 ("lens material") for the formation of passive optical elements is deposited on each of the cavities 26A, 26B of the tools 120A, 120B. Here too, the lens material 32 can be, for example, a liquid epoxy or other polymer that, when hardened (e.g., cured), is transparent to a particular wavelength or range of wavelengths. The lens material 32 can be deposited, for example, by jetting the liquid epoxy onto the cavities 26A, 26B. The two tools 120A, 120B then are aligned using, for example, a mask aligner.

Figure 6:
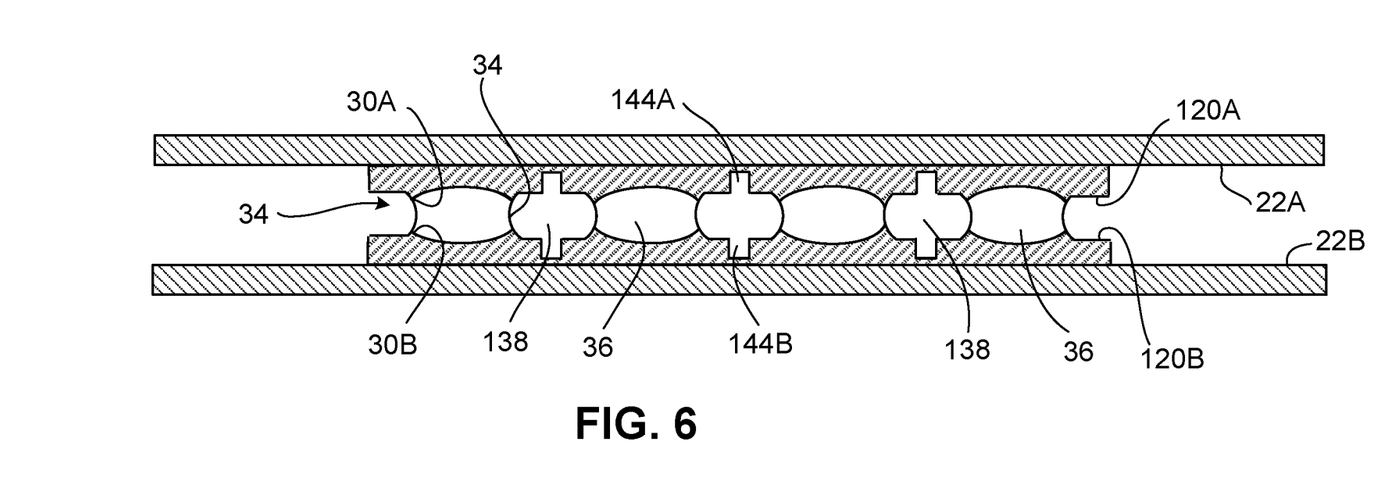

After the tools 120A, 120B are aligned, they are brought into contact with one another such that the lens material 32 on each particular cavity 26A of the first tool 120A is brought into contact with the lens material 32 on an opposing cavity 26B of the second tool 120B, as shown in FIG. 6. In some instances, one or both of the tools 120A, 120B have spacers extending toward the opposite tool so as to maintain a specified distance between the two tools when the tools are in contact with one another. As the tools are brought together, the lens material 32 on each pair of opposing cavities 26A, 26B merges into a single volume 36 of lens material. The sharp edges 30A, 30B at the lateral borders of the replication surfaces 24A, 24B cause the liquid epoxy to develop a meniscus 34 laterally around the volume 36 of lens material. After the meniscus 34 develops, the liquid epoxy lens material is hardened, for example, by UV-curing, thermal curing, or both. Each volume 36 of lens material thus forms a lens or other passive optical element. The foregoing technique allows the passive optical elements to be formed by double replication in a single replication process (i.e., replicating two different surfaces of each optical element at the same time).

Figure 7:
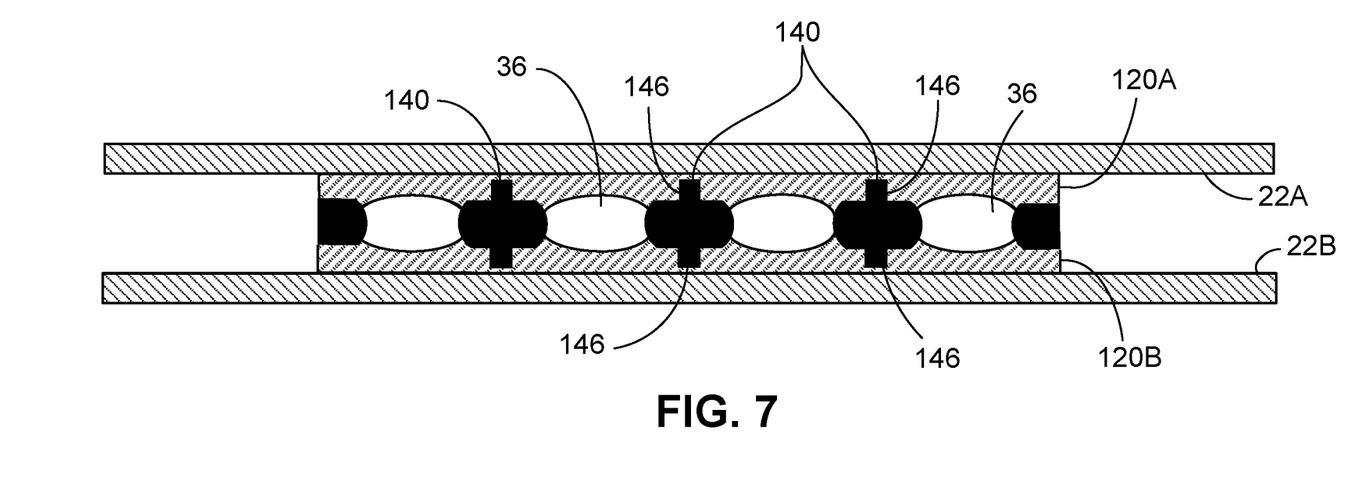
Figure 8:
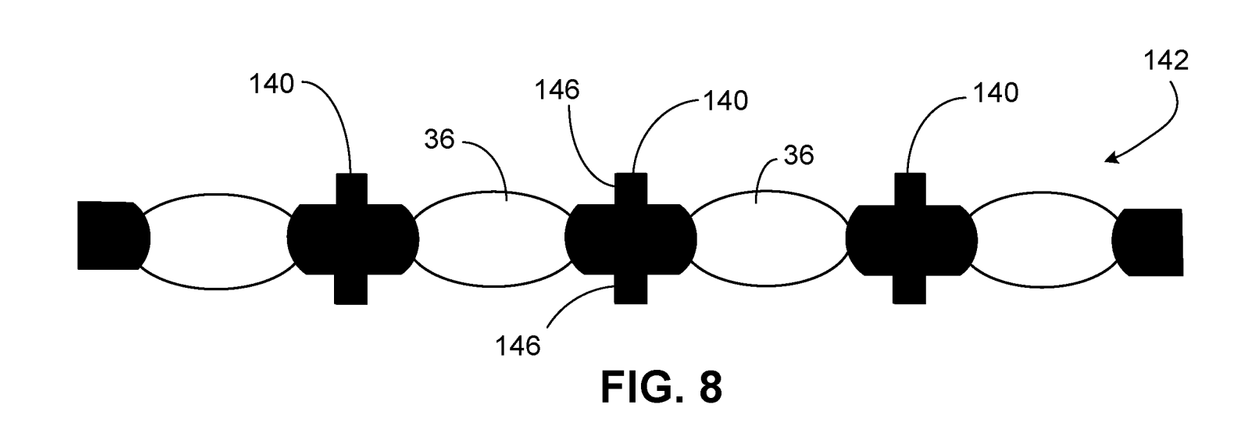
FIG. 8 illustrates a cross-sectional view of an optics wafer resulting from the process of FIGS. 5-7.

Next, the spaces 138 (including the grooves 144A, 144B) between opposing separation surfaces of the tools 120A, 120B are filled with an epoxy or other polymer that, when hardened (e.g., cured), is substantially non-transparent to the particular wavelength or range of wavelengths of interest. Examples of such polymer materials include an epoxy, acrylate, polyurethane, or silicone containing a non-transparent filler such as carbon black, a pigment, or dye. The non-transparent material can be injected into the spaces 138, for example, by vacuum injection while the tools 120A, 120B remain in place. The non-transparent, vacuum injected material then is hardened (e.g., by UV curing, thermal curing or both) to form non-transparent separation regions 140 that separate the passive optical elements 36 from one another, as shown in the example of FIG. 7. The tools 120A, 120B then can be removed to yield an optics wafer 142. As shown in FIG. 8, the optics wafer 142 includes multiple passive optical elements 36 separated from one another by non-transparent regions 140, which also serve to hold the optical elements 36 together in the optics wafer.

As explained above, there is no need for a separate glass or other substrate on which to form the lenses or other optical elements 36. The non-transparent regions 140 also serve as optical barriers or separation walls between adjacent optical elements 36. Further, these separation walls 140 have one or more contiguous projections 146 that can serve as spacers or baffles. As described above, the spacer/baffle projections 146 can be formed as part of the same vacuum injection process used to form the separation walls 140, and can be composed of the same material as the separation walls.

Although each of FIGS. 4 and 8 shows only a few optical elements 36, the foregoing techniques can be used to form an optics wafer that has tens, hundreds, or even thousands of optical elements 36 in a two-dimensional array. Each of the optics wafers 42, 142 can be attached to one or more other wafers (e.g., a printed circuit board on which are mounted active optoelectronic devices such as light emitting or light sensing devices) to form a wafer stack that subsequently is diced into individual modules, each of which includes an optical assembly (including one or more optical elements 36) disposed over an optoelectronic device such that the optical elements intersect an optical axis of the optoelectronic device.

Figure 9A:
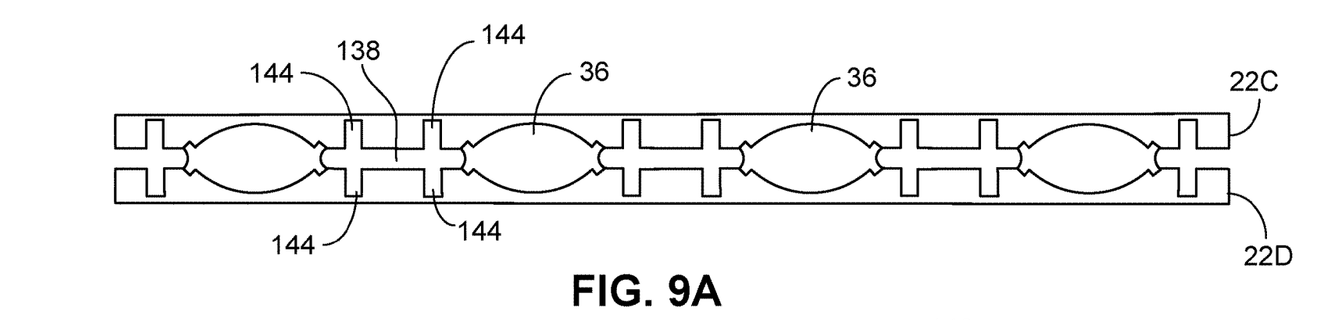
FIG. 9A illustrates modifications to the process of FIGS. 5-7.
Figure 9B:
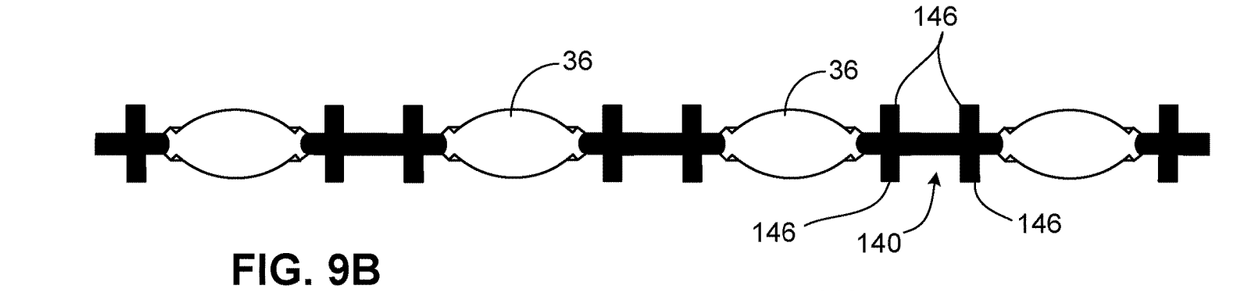
FIG. 9B illustrates a cross-sectional view of an optics wafer resulting from the modification of FIG. 9A.
Figure 9C:
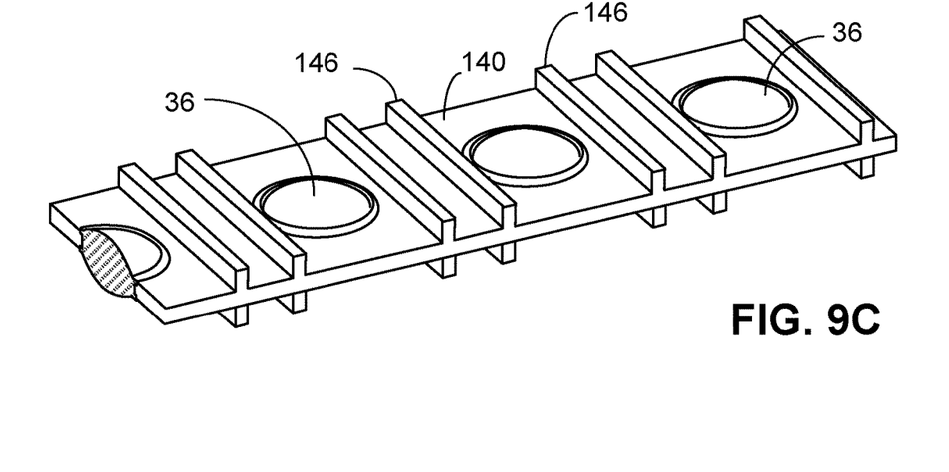
FIG. 9C illustrates a perspective view of the optics wafer of FIG. 9B.

In some instances, as shown in FIGS. 9A-9C, tools 22C, 22D can be provided with respective separation surfaces including additional grooves 144 that, when filled with the non-transparent epoxy or other polymer, form additional spacers or baffles 146 for the adjacent optical element 36. In this example, two spacers or baffles 146 separate each pair of adjacent optical elements 36. The optics wafer then can be integrated into a wafer stack that subsequently is diced into separate modules. The dicing can be performed between adjacent pairs of the spacers or baffles 146, such that each of the resulting modules includes spacers or baffles about an optical element 36.

The foregoing techniques can be modified to accommodate the formation of optics wafers having two or more optical elements (e.g., lenses) stacked one on the other. Such techniques allow, for example, doublet or triplet lenses to be formed such that the stacked optical elements are fused to one another one another. FIGS. 10A-10M illustrate a process for forming such stacked optical elements.

Figure 10A:
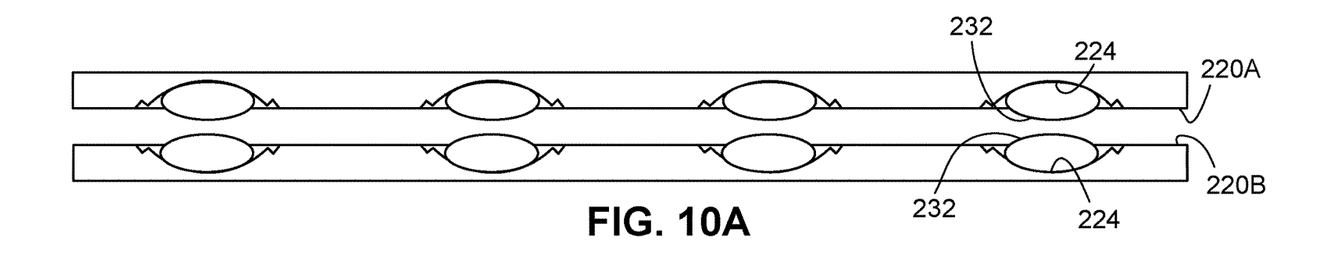
FIGS. 10A-10M illustrate steps in a third process for forming an optics wafer that includes optical elements replicated one on the other.
Figure 10B:
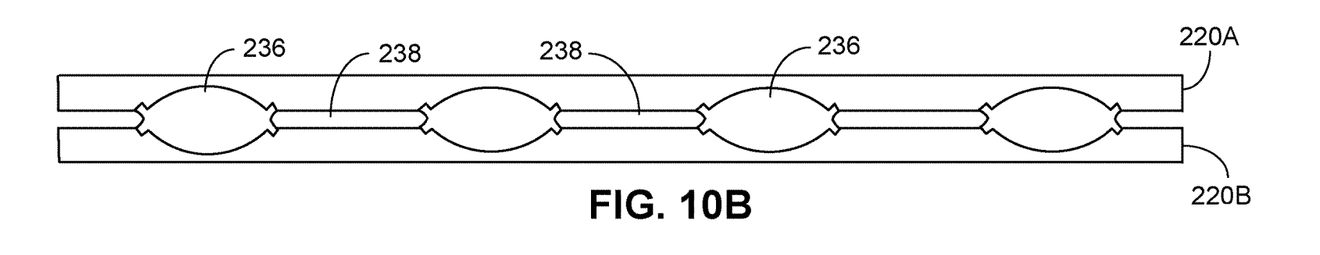
Figure 10C:
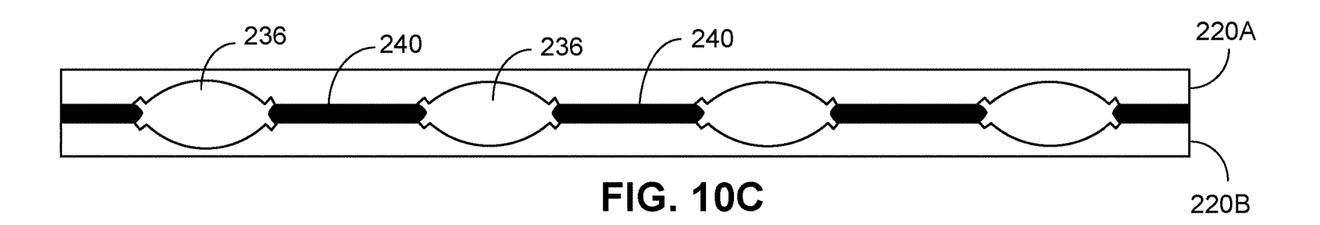
Figure 10D:
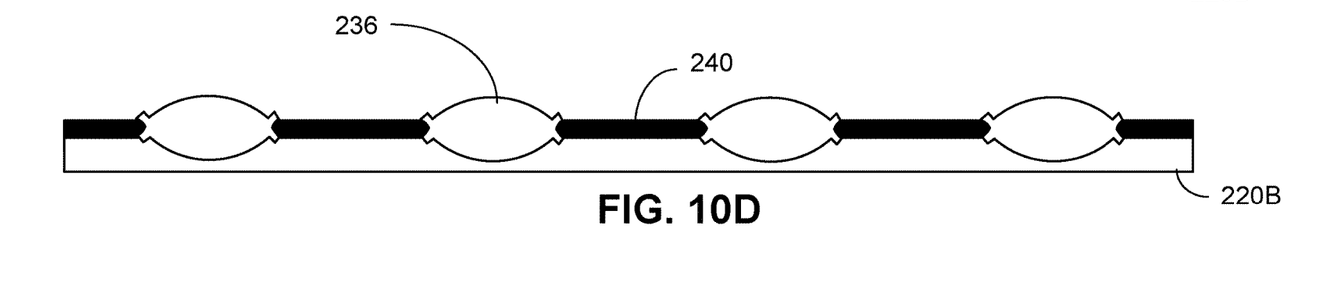

The steps shown in FIGS. 10A-10C can be substantially the same as discussed above in connection with FIGS. 1-3 and illustrate formation of a first array of replicated optical elements. Thus, as shown in FIG. 10A, each of first and second tools 220A, 220B include a respective replication surface 224 that includes, for example, concave cavities on which a transparent lens material (e.g., epoxy or other polymer) 232 is deposited. Then, as shown in FIG. 10B, the first and second tools 220A, 220B are brought close to one another such that the lens material 232 on opposing cavities merges to form a single volume of lens material. As described above, sharp edges at the lateral borders of the replication surfaces 224 can be provided to cause the liquid epoxy to develop a meniscus laterally around the volume of lens material, which then is hardened (e.g., by UV and/or thermal curing) to form the optical elements 236. A second (e.g., non-transparent) epoxy or other polymer material then is injected by vacuum injection into the spaces 238 between the optical elements 236. When hardened (e.g., by UV and/or thermal curing), this second material forms optical barriers or separation walls 240 between adjacent optical elements 236, as shown in FIG. 10C. The upper tool 220A then can be removed, as shown in FIG. 10D.

Figure 10E:
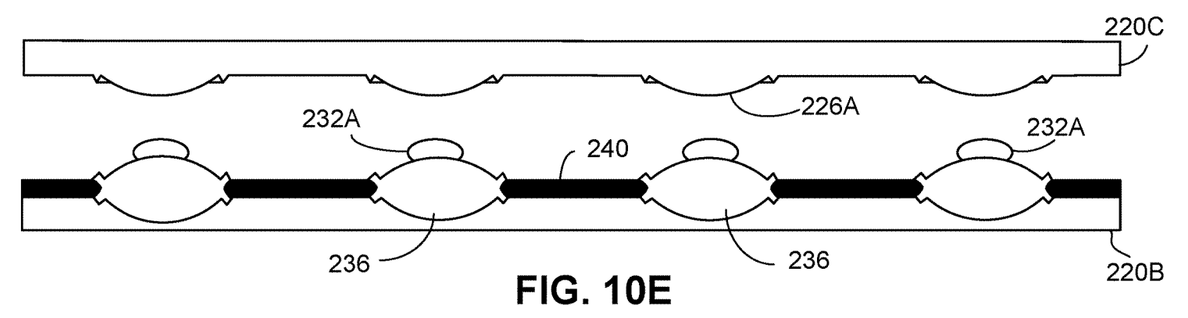
Figure 10F:
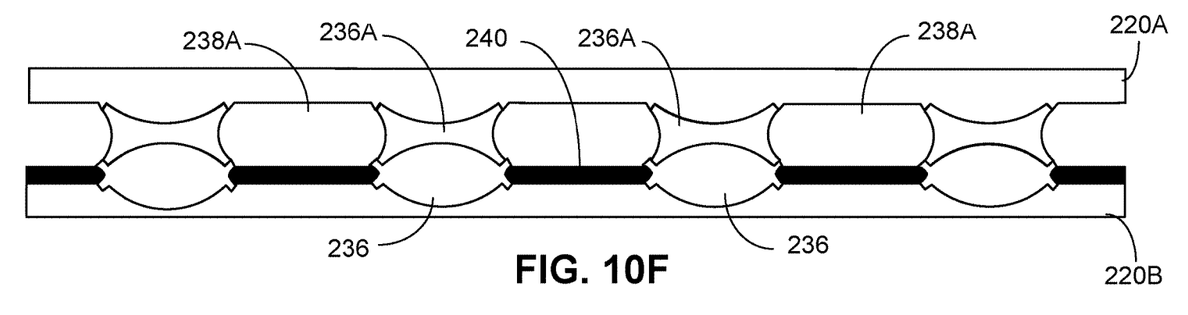
Figure 10G:
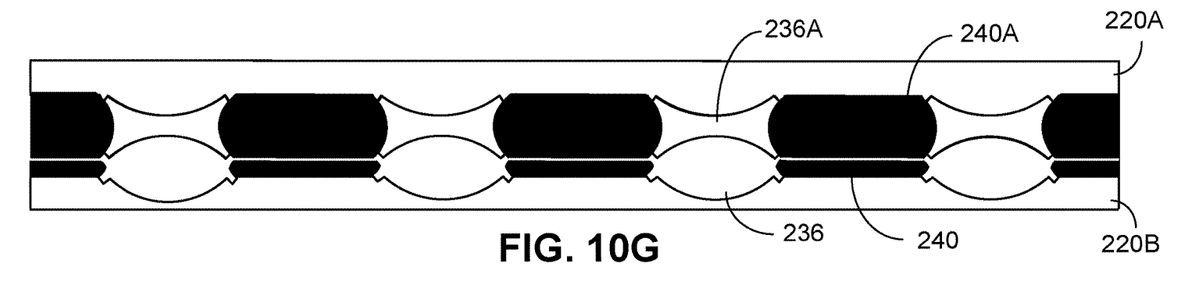

FIGS. 10E-10G illustrate formation of a second array of replicated optical elements directly on the first array of optical elements. As shown in FIG. 10E, a small amount of material 232A ("lens material") for the formation of passive optical elements is provided, for example, on each of the previously formed optical elements 236. The lens material 232A can be, for example, the same liquid epoxy or other polymer that was used for the previously formed optical elements 236 or may be a different epoxy or other polymer, that, when hardened (e.g., cured), is transparent to the particular wavelength or range of wavelengths.

As illustrated in FIG. 10E, a third tool 220C, which also serves as a combined replication and vacuum injection tool, is positioned over the second tool 220B, and the two tools 220B, 220C then are aligned using, for example, a mask aligner. In the illustrated example, the third tool 220C has a replication surface that defines convex areas 226A for replication of the second array of passive optical elements. The replication surface, however, may have a different shape depending on the shape of the optical elements to be formed.

After the tools 220B, 220C are aligned, they are moved toward one another such that the lens material 232A on each optical element 236 in the first array is brought into contact with the opposing convex-shaped portion 226A of the replication surface of the third tool 220C, as shown in FIG. 10F. One or both of the tools 220B, 220C may have spacers extending toward the opposite tool so as to maintain a specified distance between the two tools when the tools are in contact with one another. As the tools are pressed together, the convex-shaped portion 226A of the replication surface of the third tool 220C is replicated in the lens material 232A. The lens material 232A then is hardened (e.g., by UV and/or thermal curing) to form the optical elements 236A of the second array. In accordance with the foregoing process, each of the replicated optical elements 236A in the second array effectively adheres to a corresponding one of the replicated optical elements 236 in the first array, thereby forming an array of lens doublets.

Next, the spaces 238A between the previously formed separation walls 240 and the opposing surfaces of the third tool 220C are filled with an epoxy or other polymer that, when hardened (e.g., cured), is substantially non-transparent to light of the particular wavelength or range of wavelengths of interest (or significantly attenuates such light). Examples of such polymer materials include an epoxy, acrylate, polyurethane, or silicone containing a non-transparent filler such as carbon black, a pigment, or dye. The epoxy or other polymer material used to fill the spaces 238A thus can be the same as, or differ from, the epoxy or other polymer material used to fill the spaces 238. The non-transparent material can be injected into the spaces 238A, for example, by vacuum injection while the tools 220B, 220C remain in place. The non-transparent, vacuum injected material then is hardened (e.g., by UV curing, thermal curing or both) to form non-transparent separation regions 240A that separate the passive optical elements 236A from one another, as shown in the example of FIG. 10G. Each non-transparent region 240A is contiguous with an adjacent non-transparent region 240.

In some cases, the tools 220B, 220C then can be removed to yield an optics wafer that includes an array of lens doublets 236, 236A separated from one another by non-transparent regions 240, 240A. The non-transparent regions 240, 240A also serve to hold the lenses together in the optics wafer. Further, the non-transparent regions 240, 240A serve as optical barriers or separation walls between adjacent lens doublets.

Figure 10H:
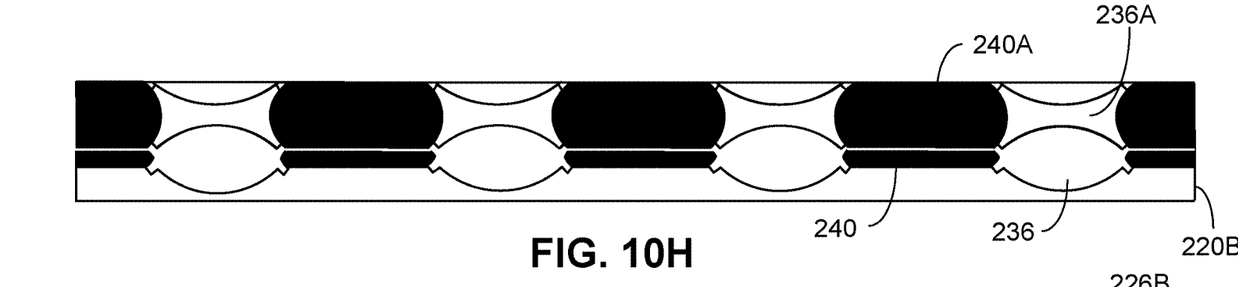
Figure 10I:
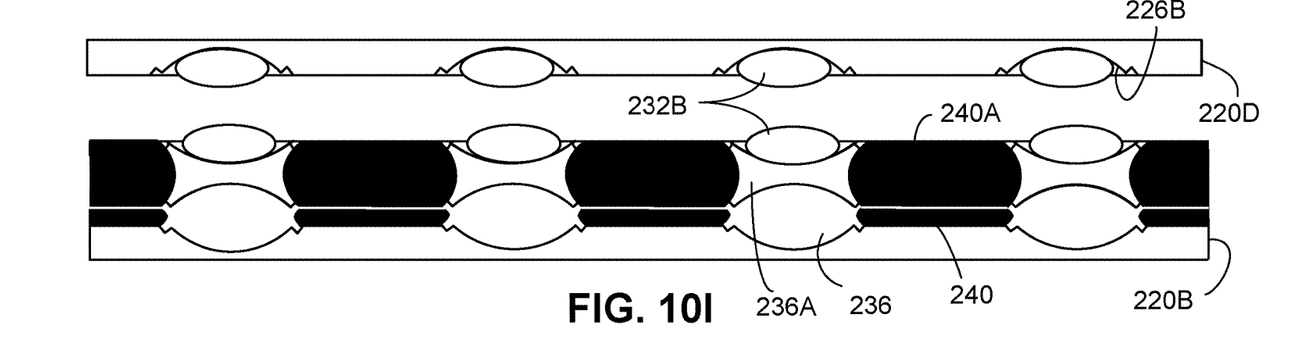

In some instances, a third array of replicated optical elements can be formed directly on the second array of optical elements 240A. FIGS. 10H-10K illustrate formation of a third array of replicated optical elements directly on the second array of optical elements. As shown in FIGS. 10H and 10I, the third tool 220C is removed, and a fourth tool 220D, which also serves as a combined replication and vacuum injection tool, is positioned over the second tool 220B. In the illustrated example, the fourth tool 220D is substantially the same as the first tool 220A, although in other implementations may differ. Thus, in the illustrated example, the fourth tool 220D has a replication surface that defines concave cavities 226B for the replication of passive optical elements (e.g., convex shaped lenses). The replication surface of the fourth tool 220D, however, may have a different shape depending on the shape of the optical elements to be formed.

As further shown in FIG. 10I, a small amount of material 232B ("lens material") for the formation of passive optical elements is deposited on each of the cavities 226B of the fourth tool 220D, as well as on the upper concave-shaped surface of each of the lenses 236A. The lens material 232B can be, for example, the same liquid epoxy or other polymer that was used for the previously formed optical elements 236 (or 236A) or may be a different epoxy or other polymer, that, when hardened (e.g., cured), is transparent to the particular wavelength or range of wavelengths. The two tools 220B, 220D then are aligned using, for example, a mask aligner.

Figure 10J:
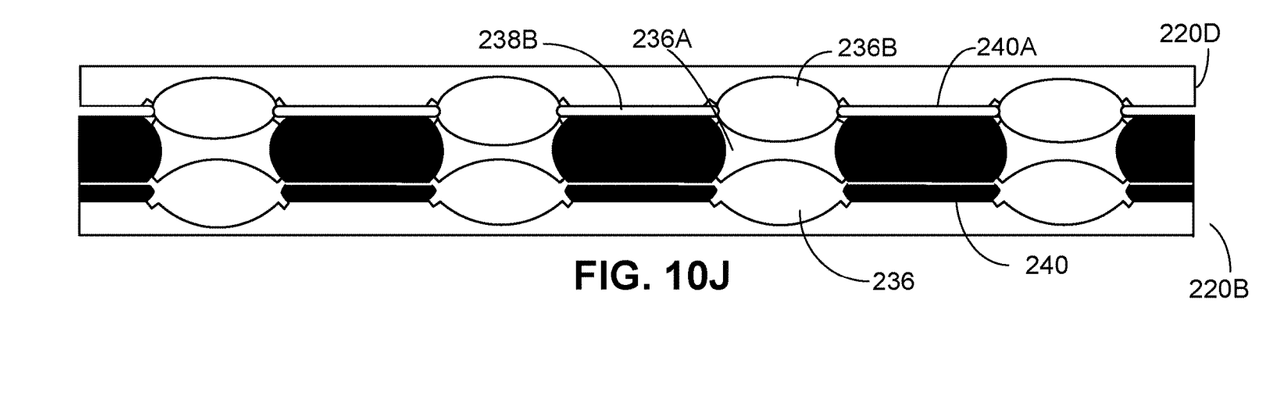

After the tools 20A, 20B are aligned, they are moved toward one another such that the lens material 232B on each particular cavity 226B of the fourth tool 220D is brought into contact with the lens material 232 on an opposing upper concave-shaped surface of one of the lenses 236A, as shown in FIG. 10J. In some instances, one or both of the tools 220B, 220D have spacers extending toward the opposite tool so as to maintain a specified distance between the two tools when the tools are brought toward one another. As the tools are brought together, the lens material 232B in a particular cavity 226B and the lens material 232B on the opposing surface of one of the lenses 236A merges into a single volume 236B of lens material. The lens material then is hardened, for example, by UV-curing, thermal curing, or both. Each volume 236B of lens material thus forms a lens or other passive optical element. In accordance with the foregoing process, each of the replicated optical elements 236B in the third array effectively adheres to a corresponding one of the replicated optical elements 236A in the second array, thereby forming an array of lens triplets.

Figure 10K:
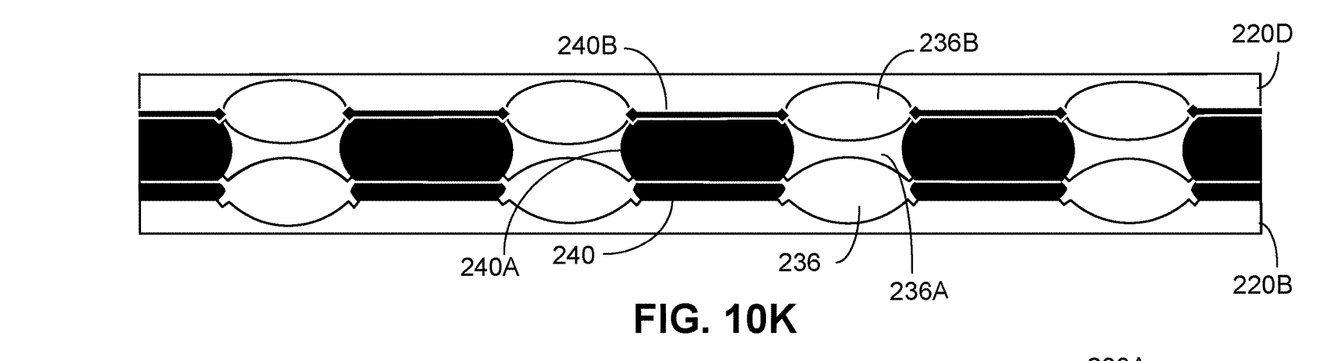
Figure 10L:
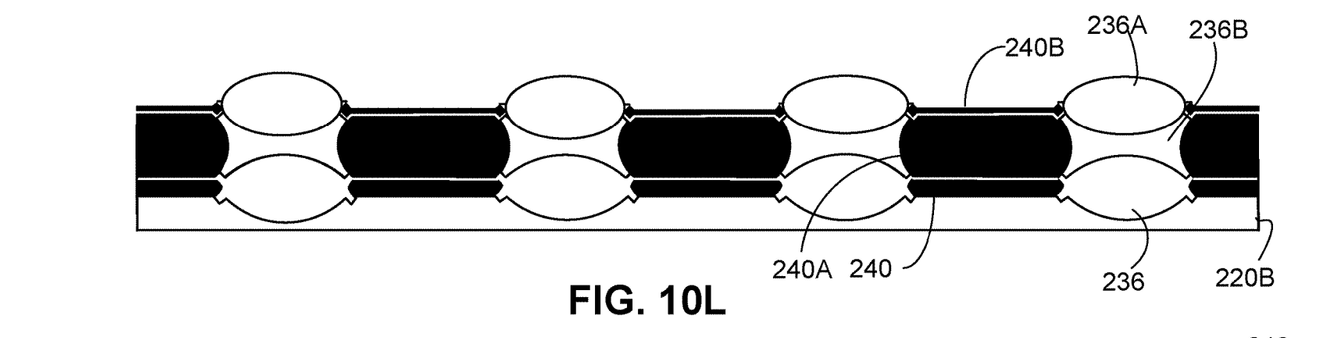
Figure 10M:
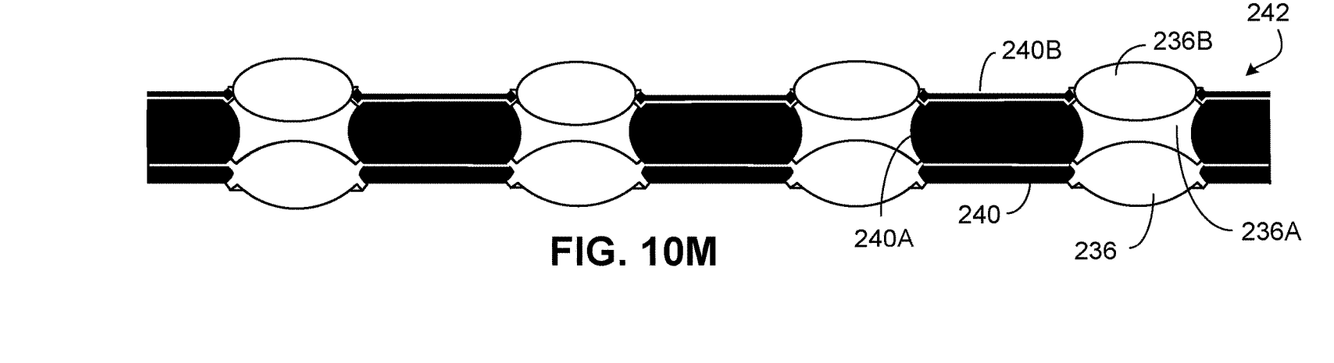

Next, the spaces 238B between the previously formed separation walls 240A and the opposing surfaces of the fourth tool 220D are filled with an epoxy or other polymer that, when hardened (e.g., cured), is substantially non-transparent to light of the particular wavelength or range of wavelengths of interest (or significantly attenuates such light). Examples of such polymer materials include an epoxy, acrylate, polyurethane, or silicone containing a non-transparent filler such as carbon black, a pigment, or dye. The epoxy or other polymer material used to fill the spaces 238B thus can be the same as, or differ from, the epoxy or other polymer material used to fill the spaces 238 and/or the spaces 238A. The non-transparent material can be injected into the spaces 238B, for example, by vacuum injection while the tools 220B, 220D remain in place. The non-transparent, vacuum injected material then is hardened (e.g., by UV curing, thermal curing or both) to form non-transparent separation regions 240B that separate the passive optical elements 236B from one another, as shown in the example of FIG. 10K. Each non-transparent region 240B is contiguous with an adjacent non-transparent region 240A.

The tools 220B, 220D then can be removed (see FIGS. 10L and 10M) to yield an optics wafer 242 that includes a two-dimensional array of lens triplets 236, 236A, 236B separated from one another by non-transparent regions 240, 240A, 240B. The non-transparent regions 240, 240A, 240B also serve to hold the lens triplets together in the optics wafer. Further, the non-transparent regions 240, 240A, 240B serve as optical barriers or separation walls between adjacent lens triplets.

The precise shape of the replication surfaces of the tools may differ from the illustrated examples to facilitate the formation of optical elements having shapes that differ from the shape of the lenses in the illustrated examples. Thus, the shape of the replication surfaces of the tools can be modified to facilitate formation of lenses having convex or concave surfaces, as well as surfaces having other shapes. The shape of the replication surfaces can be modified to facilitate formation of other types of optical elements (e.g., Fresnel lenses).

The foregoing description describes examples of optics wafers that include an array of lenses, lens doublets, or lens triplets separated from one another by optical barriers or separation walls composed of an epoxy or other polymer material different from the material of the lenses. The same processes can be used to form one or more additional levels of optical elements on the previously formed array(s).

In each of the foregoing processes, the lens epoxy or other polymer for the optical elements can be provided by jetting. Other techniques can be used as well.

In some implementations, after forming an array of replicated optical elements and prior to forming the next array of replicated optical elements, a thin coating layer having a relatively high refractive index is applied on the previously formed optical elements. The coating layer can help improve optical power. In such cases, the latter formed optical elements are replicated directly on the coating layer rather than directly onto the previously formed optical elements.

The compact optics wafers described here can be integrated, for example, into wafer stacks that subsequently are diced to form individual optoelectronic modules that can be mounted in smart phones and other small mobile computing host devices (e.g., tablets and personal data assistants (PDAs)). By obviating the need for a glass or other substrate on which to form the optical elements of the optics wafer, the foregoing techniques can, in some cases, result in a less expensive manufacturing process. Further, the resulting optics wafers can have a relatively small overall height. The smaller height can result, for example, in shorter camera stacks, that are flush with the surface of the smart phone or other computing device. In some cases, the technique also can result in a relatively small footprint for each optical element.

In the foregoing examples, after formation of the optics wafer, or after integrating the optics wafer into a wafer stack, the optics wafer (or the wafer stack) is separated, for example, by dicing, into individual lens units (or individual optoelectronic modules). The following paragraphs describe formation of optical structures in a wafer-level process in which multiple optical structures are formed at the same in parallel, but which do not subsequently need to be separated, for example, by dicing.

Figure 11:
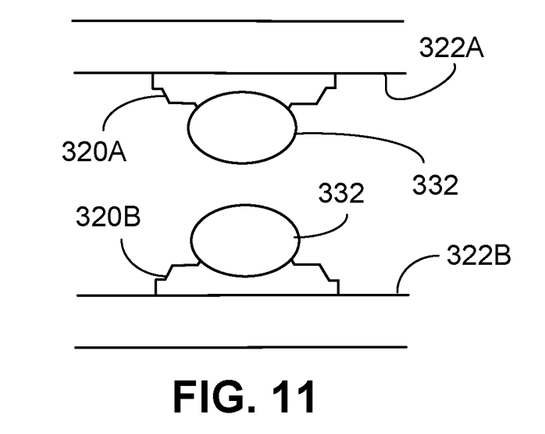
FIGS. 11-14 illustrate steps in a process for forming an optical structure.

As illustrated in FIG. 11, first and second tools 320A, 320B are held, respectively, by glass or other carriers 322A, 322B. The tools 320A, 320B serve as combined replication and vacuum injection tools because they are used for formation of replicated optical elements as well as non-transparent vacuum injected regions of the optics wafer. Lens material 332 for the formation of passive optical elements is deposited on replication surfaces of the tools 320A, 320B. Here too, the lens material 332 can be, for example, a liquid epoxy or other polymer that, when hardened (e.g., cured), is transparent to a particular wavelength or range of wavelengths. The lens material 332 can be deposited, for example, by jetting the liquid epoxy onto the replication surfaces (e.g., cavities) of the tools. In this case, the amount of lens material deposited on the replication surfaces may be greater than the relatively small amount used in the other implementations described above. The two tools 320A, 320B then are aligned using, for example, a mask aligner.

Figure 12:
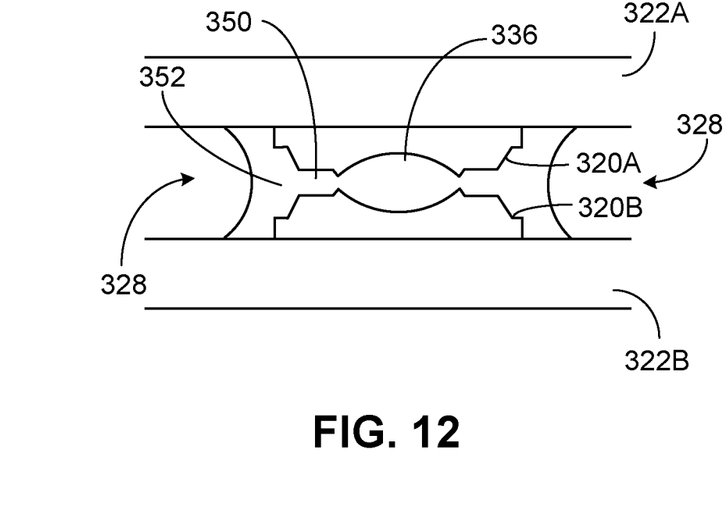

After the tools 320A, 320B are aligned, they are brought into contact with one another such that the lens material 332 on the first tool 320A is brought into contact with the lens material 332 on an opposing surface of the second tool 320B, as shown in FIG. 12. In some instances, one or both of the tools 320A, 320B have spacers extending toward the opposite tool so as to maintain a specified distance between the two tools when the tools are in contact with one another. As the tools are brought together, the lens material 332 on the opposing replication surfaces merges into a single volume 336 of lens material. Although FIG. 12 illustrates formation of only a single optical element, many such optical elements can be formed in parallel on a wafer-level scale. Preferably, the amount of lens material 332 disposed initially on the replication surfaces of the tools 320A, 320B should be sufficient to form (in addition to the lens) a lens yard 350 laterally surrounding the lens 336, as well as a spacer region 352 laterally surrounding the lens yard 350, when the tools press the lens material 332. The spacer region 352 can surround laterally, for example, at least a portion of the sides of the tools 320A, 320B. The lens material then is hardened (e.g., by UV and/or thermal curing).

Figure 13:
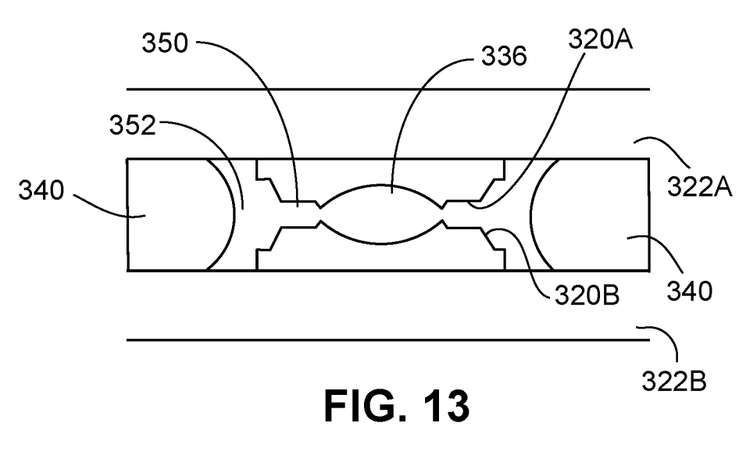

Next, spaces 328 between opposing surfaces of the toll carriers 322A, 322B are filled with an epoxy or other polymer 340 that differs from the material 332 used to form the optical elements 336 (see FIG. 13). For example, preferably, the spaces 328 are filled with an epoxy or other polymer that, when hardened (e.g., cured), is substantially non-transparent (or significantly attenuates) to light of the particular wavelength or range of wavelengths of interest. Examples of such polymer materials include an epoxy, acrylate, polyurethane, or silicone containing a non-transparent filler such as carbon black, a pigment, or dye. The non-transparent material can be injected into the spaces, for example, by vacuum injection while the tools 320A, 320B remain in place.

Figure 14:
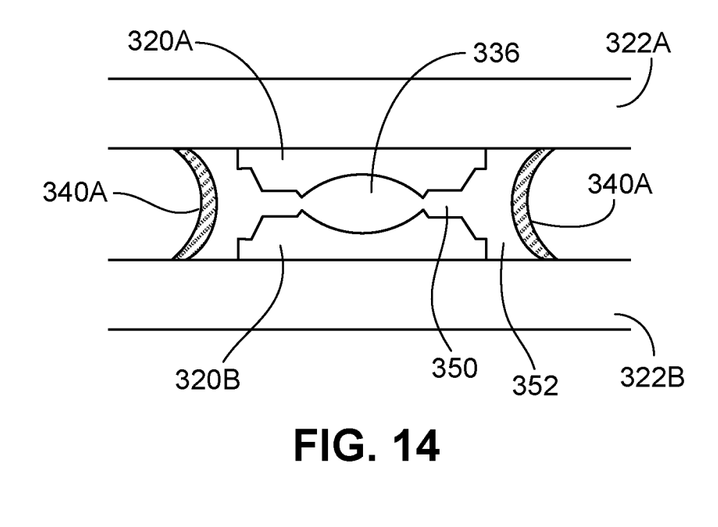

The flow of black epoxy or other polymer 340 then is turned off while maintaining the vacuum line. The vacuum flushes out most of the black epoxy or other polymer 340, but retains a small amount of the black epoxy or other polymer as a coating 340A along the outer sidewalls of each lens unit (i.e., on the lateral sides of the spacer region 352), as shown in FIG. 14. The epoxy or other polymer 340 then is hardened (by UV and/or thermal curing).

Figure 15:
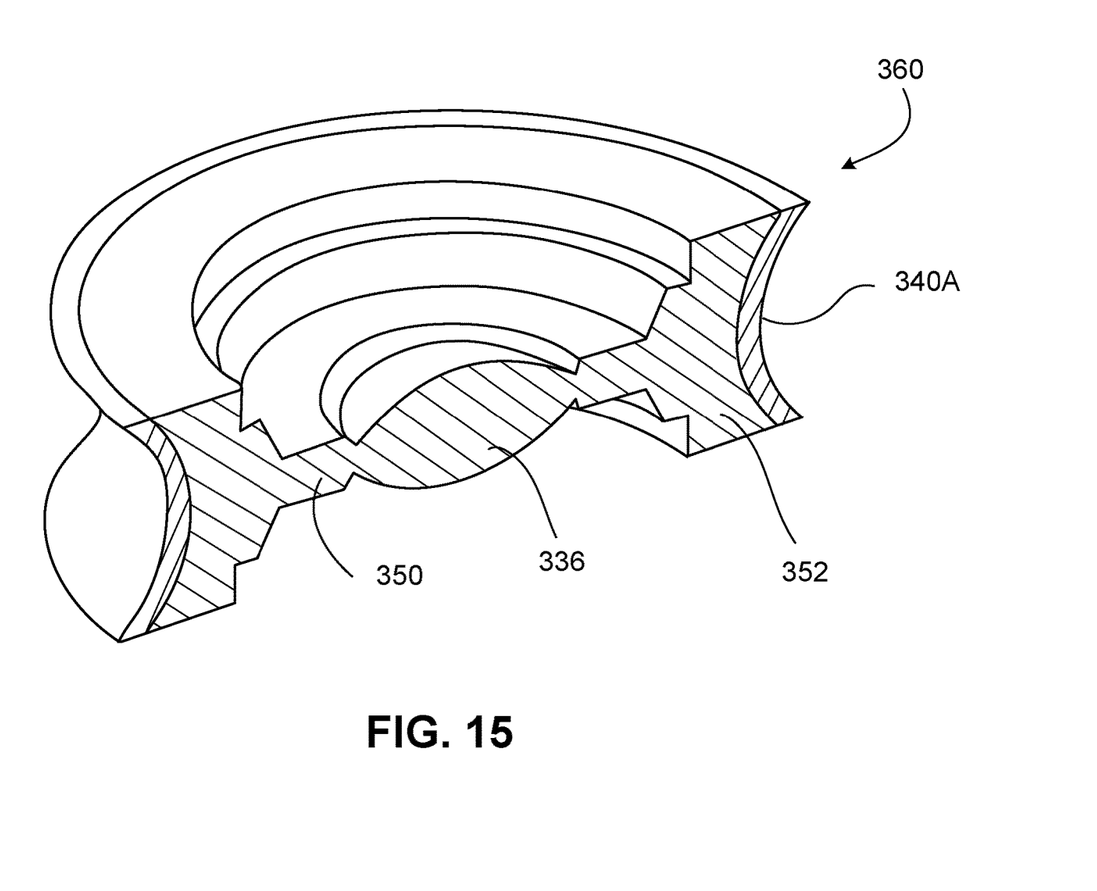
FIG. 15 illustrates an example of the optical structure resulting from the process of FIGS. 11-14.

In some instances, both tools 320A, 320B are removed from the resulting lens units, an example 360 of which is shown in FIG. 15. In some case, however, only one of the tools (e.g., the upper tool 320A) initially is removed from the resulting lens units. Before removing the second tool, a carrier tape is placed on the top of the lens units. The second (e.g., lower) tool 320B then can be removed from the lens units. The carrier tape, on which are mounted multiple, separate lens units can be provided, for example, to an integrated circuit manufacturer or other entity that uses pick-and-place equipment to integrate individual lens units into sensors or other modules in host devices (e.g., smartphones).

A sensor module including the lens unit can be mounted, for example, on a printed circuit board. The printed circuit board may be a constituent of a host device such as a hand-held communications or computing device (e.g., a mobile phone, smart phone, personal digital assistant (PDA) or laptop). In some cases, the sensor modules may be integrated into small electronic devices, such as bio devices, mobile robots, surveillance cameras, camcorders, laptop computers, and tablet computers, among others. A smart phone, for example, may include a processor, memory, an input/output device (including an interactive display), a communications interface, and a transceiver, among other components. The various components can be interconnected using various buses, and several of the components may be mounted on a common motherboard or in other manners as appropriate. The sensor module also can be interconnected to other components in the smart phone device and, in some implementations, can be mounted on the common motherboard with some of the other components.

Various modifications can be made within the spirit of the invention. Accordingly, other implementations are within the scope of the claims.

What is claimed is:

1. A method of manufacturing an optics assembly, the method comprising:
    providing a first polymer material on respective replication surfaces of first and second tools;
    bringing the first and second tools toward one another such that the first polymer material on a replication surface of the first tool merges with the first polymer material on an opposing replication surface of the second tool;
    subsequently hardening the first polymer material to form a first group of optical elements having optical surfaces based on respective shapes of the replication surfaces on which the first polymer was provided and a surrounding portion laterally surrounding the respective optical elements;
    vacuum injecting a second polymer material into spaces between the first and second tools such that the at least some of the vacuum injected second polymer material is in contact with lateral side edges of the optical elements, and wherein the second polymer material is different from the first polymer material;
    continuing to apply a vacuum after injecting the second polymer material so as to remove a portion of the previously injected second polymer material, and so as leave a coating of the second polymer material on the lateral sides of each of the surrounding portions;
    subsequently hardening the second polymer material to form an optics assembly that includes the optical elements the respective surrounding portion, and the coating on the lateral sides of the respective surrounding portion;
    removing the first and second tools from the optics assembly;
    replicating a second group of optical elements on the optical elements of the first group such that each optical element of the first group has an optical surface in direct contact with a respective optical surface of a respective optical element of the second group; and
    injecting a third polymer material into spaces between lateral side edges of the optical elements of the second group, and hardening the third polymer,
    wherein the method is performed at wafer-level.

2. The method of claim 1 wherein at least one of the first or second polymer materials is a curable epoxy.

3. The method of claim 1 wherein the hardened second polymer material forms optical barriers between different ones of the optical elements.

4. The method of claim 1 wherein at least one of the first or second tools includes grooves in regions between the replication surfaces wherein the first polymer material is provided,
    wherein injecting a second polymer material includes providing the second polymer material into the grooves and the spaces,
    wherein, upon hardening the second polymer material, portions of the hardened second polymer material in the grooves forms spacers or baffles that are contiguous with the hardened second polymer material in the spaces.

5. The method of claim 4 wherein the spacers or baffles extend in a direction perpendicular to a plane of the optical elements.

6. The method of claim 1 wherein the optical elements are lenses.

7. The method of claim 1 wherein bringing the first and second tools toward one another such that the first polymer material on replication surfaces of the first tool merges with the first polymer material on opposing replication surfaces of the second tool causes a meniscus to form that defines the lateral side edges of a respective one of the optical elements.

8. The method of claim 1 wherein each optical element of the second group is replicated directly on a respective optical element of the first group.

9. The method of claim 1 further including:
    forming a coating layer on the optical elements of the first group; and subsequently replicating the second group of optical elements directly on the coating layer.

10. The method of claim 1 further including:
replicating a third group of optical elements on the optical elements of the second group; and
injecting a fourth polymer material into spaces between lateral side edges of the optical elements of the third group, and hardening the fourth polymer.

11. The method of claim 10 wherein each optical element of the third group is replicated directly on a respective optical element of the second group.

12. The method of claim 1,
wherein injecting the third polymer material into spaces between lateral side edges of the optical elements of the second group comprises injecting the third polymer material directly on the hardened second polymer material.

13. The method of claim 12,
wherein injecting the third polymer material comprises injecting the third polymer material between on the hardened second polymer material and a surface of a third tool.

14. The method of claim 4,
wherein both the first and second tools each include separation surfaces extending in a lateral direction between the adjacent replication surfaces where the first polymer is provided and wherein the grooves are recessed with respect to the separation surfaces of the first and second tools.

15. The method of claim 14,
wherein the hardened second polymer material with the formed spacers or baffles has a thickness that is greater than a thickness of the first group of optical elements, wherein the thicknesses are measured in a vertical direction perpendicular to the lateral direction.

16. An optical assembly comprising:
an array of a plurality of replicated optical elements stacked one upon another, wherein each of the optical elements is fused to an adjacent one of the optical elements such that an optical surface of each optical element is in direct contact with a respective optical surface of a respective adjacent optical element, wherein each of the plurality of replicated optical elements stacked upon another comprises an optical element having convex optical surfaces sandwiched between a pair optical elements having concave optical surfaces
wherein the plurality of replicated optical elements is surrounded laterally by a separation material that is fused to lateral side edges of the optical elements, wherein the separation material differs from a material of which the optical elements are composed,
wherein each of the optical elements has respective first and second optical surfaces different from the lateral side edges, and wherein the material of which each of the optical elements is composed is the same throughout a thickness of the optical element from its first optical surface to its second optical surface.

17. A module comprising:
an optoelectronic device having an optical axis; and
an optical assembly as in claim 16 disposed over the optoelectronic device and intersecting the optical axis.

18. A handheld computing or communications device comprising:
the module of claim 17.

19. A wafer-level method of manufacturing optical structures, the method comprising:
providing a first polymer material on respective replication surfaces of first and second tools; bringing the first and second tools toward one another such that the first polymer material on a replication surface of the first tool merges with the first polymer material on an opposing replication surface of the second tool;
subsequently hardening the first polymer material to form respective optical structures each of which includes an optical element and a surrounding portion laterally surrounding the respective optical structure;
vacuum injecting a second polymer material such that the at least some of the vacuum injected second polymer material is in contact with lateral sides of the surrounding portions of the optical elements, wherein the second polymer material is different from the first polymer material;
continuing to apply a vacuum after injecting the second polymer material so as to remove a portion of the previously injected second polymer material, and so as leave a coating of the second polymer material on the lateral sides of each of the surrounding portions;
subsequently hardening the second polymer material to form the optical structures each of which includes: one of the optical elements, the respective surrounding portion, and the coating on the lateral sides of the respective surrounding portion;
removing the first and second tools from the optical structures;
replicating second optical structures on the optical structures such that each optical element of the optical structures has an optical surface in direct contact with a respective optical surface of a respective optical element of the second optical structures.

* * * * *